United States Patent
Wu et al.

(10) Patent No.: US 7,337,424 B2
(45) Date of Patent: Feb. 26, 2008

(54) FLEXIBLE SHAPE IDENTIFICATION FOR OPTICAL PROXIMITY CORRECTION IN SEMICONDUCTOR FABRICATION

(75) Inventors: Shao-Po Wu, Portola Valley, CA (US); Xin Wang, Sunnyvale, CA (US); Mark Pilloff, Millbrae, CA (US)

(73) Assignee: Aprio Technologies, Inc., Santa Clara, CA (US)

( * ) Notice: Subject to any disclaimer, the term of this patent is extended or adjusted under 35 U.S.C. 154(b) by 384 days.

(21) Appl. No.: 11/089,723

(22) Filed: Mar. 24, 2005

(65) Prior Publication Data

US 2006/0236287 A1    Oct. 19, 2006

(51) Int. Cl.
*G06F 17/50* (2006.01)
(52) U.S. Cl. ...................................................... 716/19
(58) Field of Classification Search ............... 716/5, 716/19–21, 7; 430/30, 321; 382/144
See application file for complete search history.

(56) References Cited

U.S. PATENT DOCUMENTS 5,557,438 A * 9/1996 Schwartz et al. ........... 359/204
2002/0152454 A1* 10/2002 Cote et al. .................... 716/21
2003/0061592 A1* 3/2003 Agrawal et al. .............. 716/19
2003/0163791 A1* 8/2003 Falbo et al. .................... 716/2
2004/0225990 A1* 11/2004 Jacques et al. ............... 716/13
2005/0229131 A1* 10/2005 Wu et al. ....................... 716/8
2005/0257181 A1* 11/2005 Wu ................................ 716/4
2006/0248499 A1* 11/2006 Sezginer et al. ............. 716/21

* cited by examiner

*Primary Examiner*—Paul Dinh
*Assistant Examiner*—Nha Nguyen
(74) *Attorney, Agent, or Firm*—Fenwick & West LLP

(57) ABSTRACT

Transient edges are used to define shapes in an integrated circuit layout for optical proximity correction. A first variation of the shape includes a first edge, a second edge satisfying an edge transition angle condition in relation to the first edge, and one or more first transition edges connected between the first edge and the second edge. A second variation of the shape includes a third edge, a fourth edge satisfying the same edge transition angle condition in relation to the third edge, and one or more second transition edges connected between the third edge and the fourth edge. Although the first transition edges are different from the second transition edges, both the first and second variations of the shape are identified as having the same shape, thereby allowing flexibility and efficiency in the shape identification process for optical proximity correction.

40 Claims, 9 Drawing Sheets

US 7,337,424 B2

FLEXIBLE SHAPE IDENTIFICATION FOR OPTICAL PROXIMITY CORRECTION IN SEMICONDUCTOR FABRICATION

TECHNICAL FIELD

The present invention relates to optical proximity correction in semiconductor fabrication, and more specifically, to flexible shape identification in the layout of integrated circuits for optical proximity correction.

BACKGROUND OF THE INVENTION

Resolution-enhancement technologies (RET), such as optical proximity correction (OPC), are widely applied to the layouts of integrated circuits (ICs) in semiconductor fabrication processes in order to improve manufacturability and yield. Often times, different shapes of the polygons in the IC layout require different types or degrees of OPC. Therefore, OPC involves identifying certain shapes and fragments in the polygons of the IC layouts, and applying the appropriate type and degree of OPC to the identified shapes.

In order to identify shapes in the IC layouts, conventional OPC systems define shapes with rigid rules indicating how the edges in the defined shape are connected to each other. These rules also define what the length of the edges should be and what angle the edges should form. However, the rigid shape definitions in conventional OPC systems have the disadvantage that even a minor variation of a certain shape has to be defined as another new shape, because the rigid shape definitions do not accommodate variations of the defined shapes. Thus, the conventional OPC systems require a number of shape definitions corresponding to many of the possible variations of the shapes of the polygons in an IC layout. This is very inconvenient and cumbersome. Even then, it is almost impossible to contemplate and define every type of shape that may exist in an IC layout.

Therefore, there is a need for more flexible shape definitions for use in OPC where each shape definition can cover variations of its defined shape. There is also a need for more flexible shape definitions for use in OPC where variations of a shape are also identified as having the same shape.

SUMMARY OF THE INVENTION

The present invention provides a method of defining and identifying shapes in an integrated circuit layout using transient edges, for resolution enhancement of the IC layout such as optical proximity correction. By use of transient edges, different variations of a shape are determined to have the same shape.

A first variation of the shape includes a first edge in the layout, a second edge satisfying an edge transition angle condition in relation to the first edge in the layout, and one or more first transition edges connected between the first edge and the second edge in the layout. A second variation of the shape includes a third edge in the layout, a fourth edge satisfying the same edge transition angle condition in relation to the third edge in the layout, and one or more second transition edges connected between the third edge and the fourth edge in the layout. Although the first transition edges may be different from the second transition edges, both the first variation of the shape and the second variation of the shape are identified as having the same shape.

The first edge, the second edge, the first transition edges, the third edge, the fourth edge, and the second transition edges are located between polygon vertices on the layout, may satisfy length conditions associated with the edges, and may be further fragmented with fragment vertices. The edge transition angle between the first edge and the second edge is measured by extending the first edge and measuring an angle counter-clockwise from the extended first edge to the second edge, where the first and second edges are in the order of tracing of the edges counter-clockwise or clockwise.

In one embodiment, the shape is an outer corner shape, the edge transition angle is 90 degrees to 135 degrees, and there are zero to a predetermined number of the first transition edges and zero to the predetermined number of the second transition edges. In another embodiment, the shape is an inner corner shape, the edge transition angle is 270 degrees to 315 degrees, and there are zero to a predetermined number of the first transition edges and zero to the predetermined number of the second transition edges. In still another embodiment, the shape is a line-end shape, the edge transition angle is 180 degrees, and there are one to a predetermined number of the first transition edges and one to the predetermined number of the second transition edges. In still another embodiment, the shape is a turn-end shape, the edge transition angle is 0 degrees, and there are one to a predetermined number of the first transition edges and one to the predetermined number of the second transition edges.

By use of transient edges, different variations of one shape in the IC layout may be identified and classified as having the same shape, thereby allowing flexibility and efficiency in the definition and identification of shapes in the IC layout for optical proximity correction. Since the variations of the shape are classified as having the same shape, the same type and degree of optical proximity correction can be applied to the different variations of the shape, thereby simplifying the optical proximity correction process for the IC layout.

BRIEF DESCRIPTION OF THE DRAWINGS

The teachings of the present invention can be readily understood by considering the following detailed description in conjunction with the accompanying drawings. Like reference numerals are used for like elements in the accompanying drawings.

The figures depict embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION OF EMBODIMENTS

Figure 1:
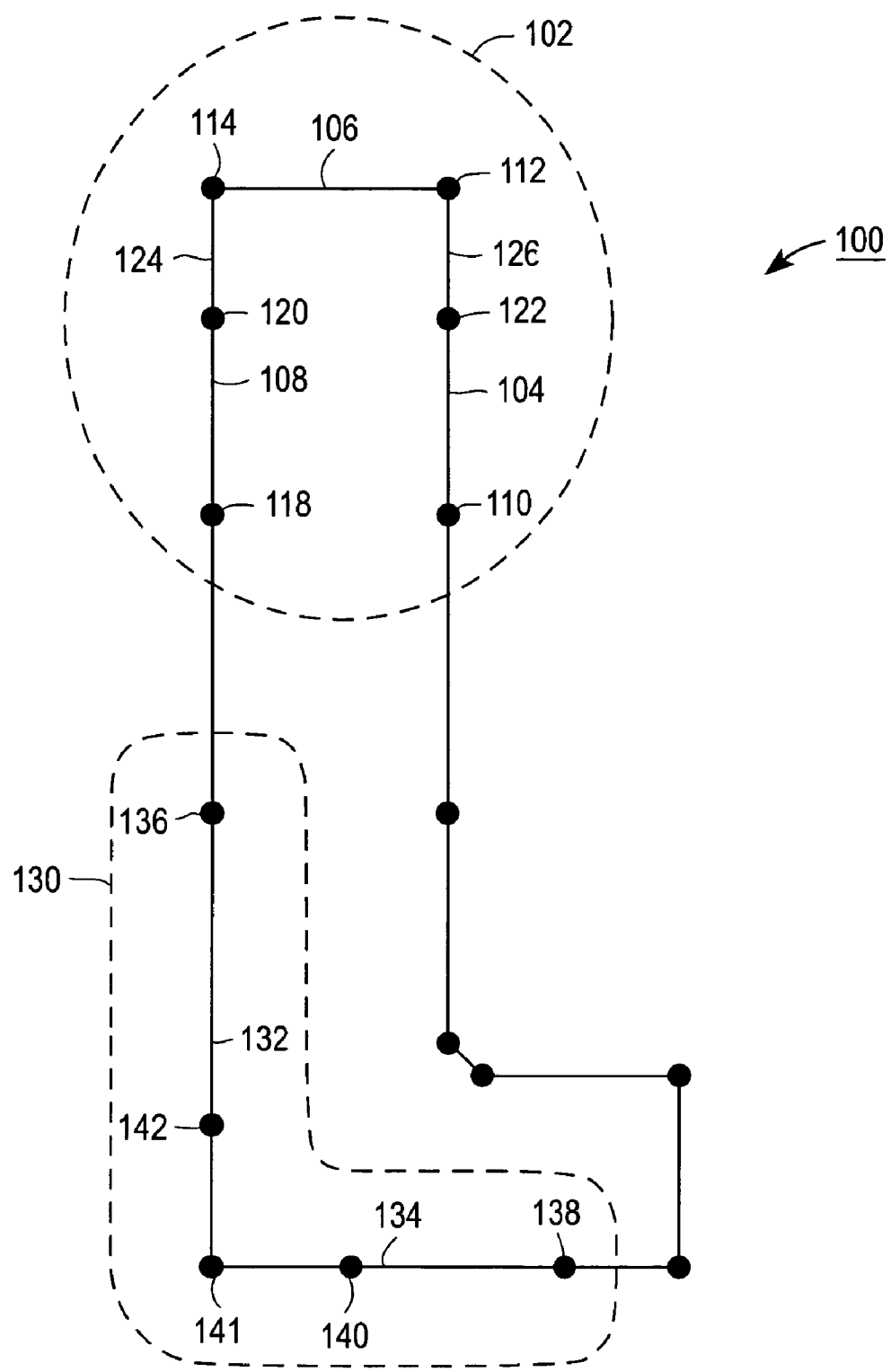
FIG. 1 illustrates the shapes, edges, fragments, and vertices of an IC layout, according to one embodiment of the present invention.

FIG. 1 illustrates the shapes, edges, fragments, and vertices of an IC layout 100 according to one embodiment of the present invention. In order to apply OPC to the IC layout 100, various shapes such as the line end shape 102 and the outer corner shape 130 are identified. Different types and degrees of OPC are applied depending upon the shape.

A shape is comprised of a sequence of connecting edges satisfying certain sets of constraints. Depending upon the attributes of the edges and the way the edges are connected, different shapes are formed. Each edge is a segment of the IC layout 100 located between two vertices of a polygon, and the edge length is the distance between those two polygon vertices. For example, the line end shape 102 is comprised of edges 104 (between polygon vertices 110, 112), 106 (between polygon vertices 112, 114), and 108 (between polygon vertices 114, 118). The outer corner shape 130 is comprised of edges 132 (between polygon vertices 136, 141) and 134 (between polygon vertices 141, 138).

Each edge may be further divided to two or more fragments. A fragment is a segment of an edge located between a pair of fragment vertices. For example, the edge 104 may be further divided to fragment 126 (between fragment vertices 112, 122) and another fragment between fragment vertices 122, 110. The edge 108 may be further divided to fragment 124 (between fragment vertices 114, 120) and another fragment between fragment vertices 120, 108. The fragment length is the distance between the two fragment vertices. OPC is applied to a fragment to compensate for the lithographic effect so that the silicon image of the layout closes matches the original layout. Each fragment may be associated with a fragment type (e.g., edge, corner, line-end edge, etc.) and the type of OPC applied to the IC layout 100 may be different depending upon the fragment type. Note that an edge itself can be regarded as a single fragment, often for short edges.

Figure 2A:
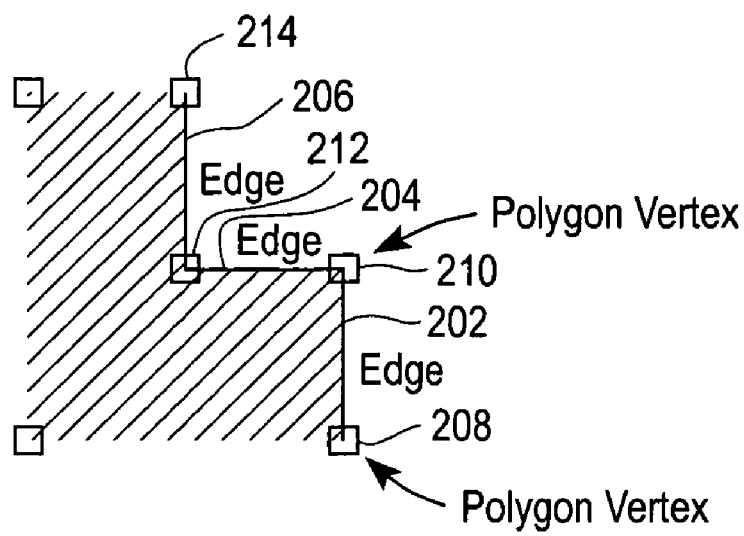
FIG. 2A is illustrates the definition of edges according to one embodiment of the present invention.

FIG. 2A further illustrates the definition of edges according to one embodiment of the present invention. As explained above, each edge is a segment of the IC layout located between two vertices of a polygon, and the edge length is the distance between those two polygon vertices. In the polygon shown in FIG. 2A, the edge 202 is the segment of the polygon between polygon vertices 208, 210, edge 204 is the segment between polygon vertices 210, 212, and the edge 206 is between the polygon vertices 212, 214.

Figure 2B:
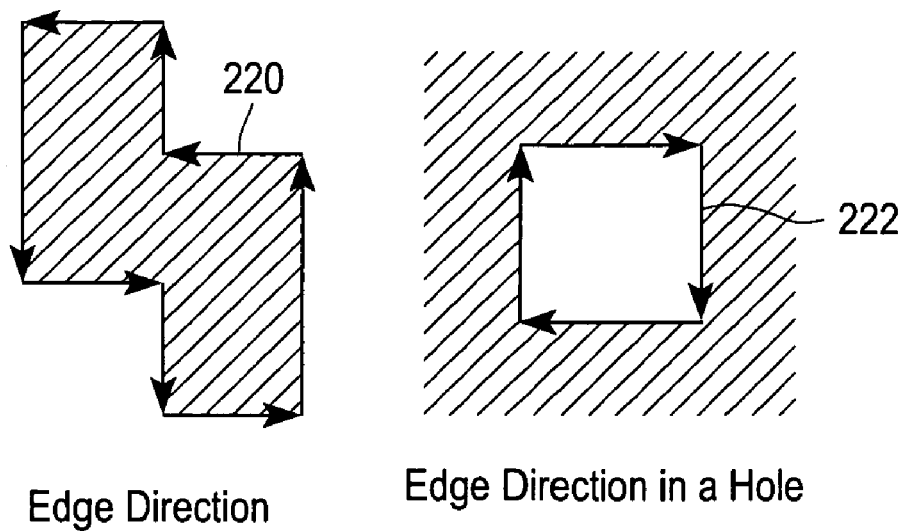
FIG. 2B illustrates the definition of edge direction according to one embodiment of the present invention.

FIG. 2B illustrates the definition of edge direction according to one embodiment of the present invention. In order to identify shapes in the IC layout, each of the edges of the polygons in the IC layout is assigned an edge direction. When two edges are connected, the edge direction is given by the tracing of these edges. In one embodiment, as shown in FIG. 2B, the edge directions are determined by tracing the edges counter-clockwise in an inner filled polygon 220, while the edges are traced clockwise in a polygon 222 that has a hole. However, it should be noted that the edge directions can be opposite to those described FIG. 2B in another embodiment. The orientation of the edge directions can be changed so long as it is used consistently throughout the IC layout.

Figure 2C:
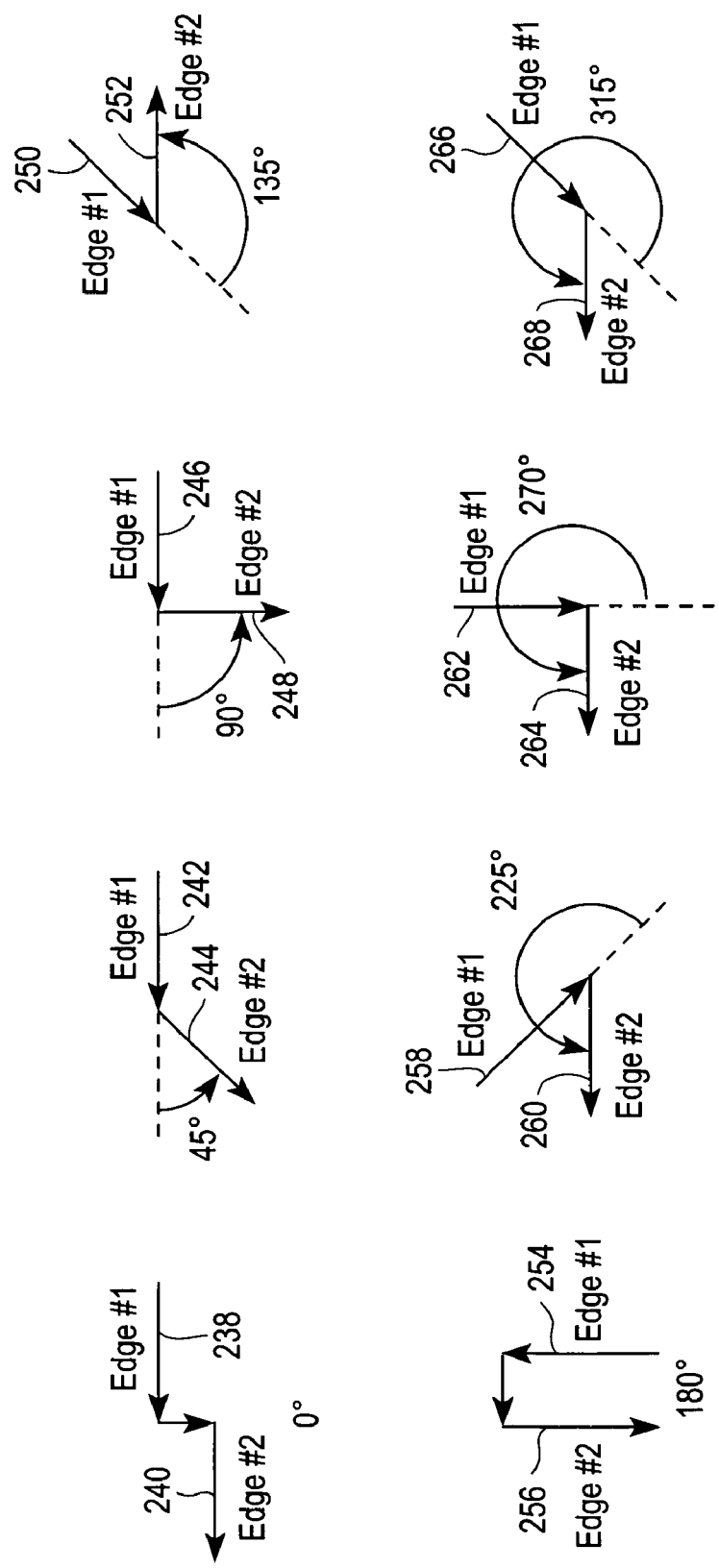
FIG. 2C illustrates the definition of edge transition angle according to one embodiment of the present invention.

FIG. 2C illustrates the definition of edge transition angle according to one embodiment of the present invention. The angle between two connecting edges should be determined in order to accurately identify shapes to perform fragmentation and OPC correction on the IC layout. In one embodiment of the present invention, an angle between two edges is measured by extending the first edge and then measuring the angle counter-clockwise from the extended first edge to the second edge, where the first and second edges are in the order of tracing of the edges in accordance with the edge directions as explained above.

Referring to FIG. 2C, for example, the angle between the edges 238, 240 is 0 degrees, and the angle between the edges 242, 244 is 45 degrees. The angle between the edges 246, 248 is 90 degrees, and the angle between the edges 250, 252 is 135 degrees. The angle between the edges 254, 256 is 180 degrees, and the angle between the edges 258, 260 is 225 degrees. The angle between the edges 262, 264 is 270 degrees, and the angle between the edges 266, 268 is 315 degrees.

Figure 3:
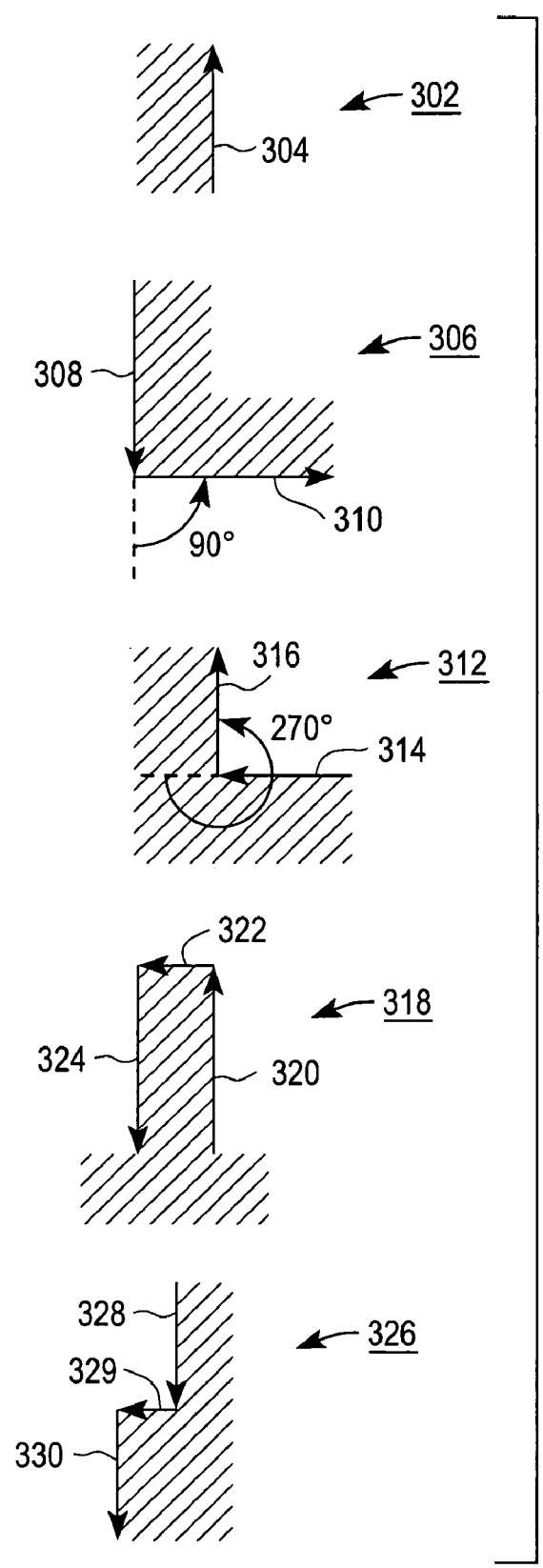
FIG. 3 illustrates examples of various shapes according to one embodiment of the present invention.

FIG. 3 illustrates examples of various shapes according to one embodiment of the present invention. As stated above, a shape is a sequence of connecting edges that satisfy certain constraints. Depending upon the attributes of the edges and the way they are connected, different shapes are formed. For example, a long edge 304 forms an edge shape 302. An outer corner shape 306 can be formed by two edges 308, 310 connected with an edge angle of 90 degrees. An inner corner shape 312 can be formed by two edges 314, 316 connected with an edge angle of 270 degrees. A line-end shape 318 can be formed by two long parallel edges 320, 324 with opposite directions (180 degree edge transition angle) joined by a relatively short edge 322 connected between the two long parallel edges 320, 324. A turn-end shape 326 can be formed by two long parallel edges 328, 330 with the same direction (0 degree edge transition angle) joined by a relative short edge 329 connected between the two long parallel edges 328, 330.

Figure 4:
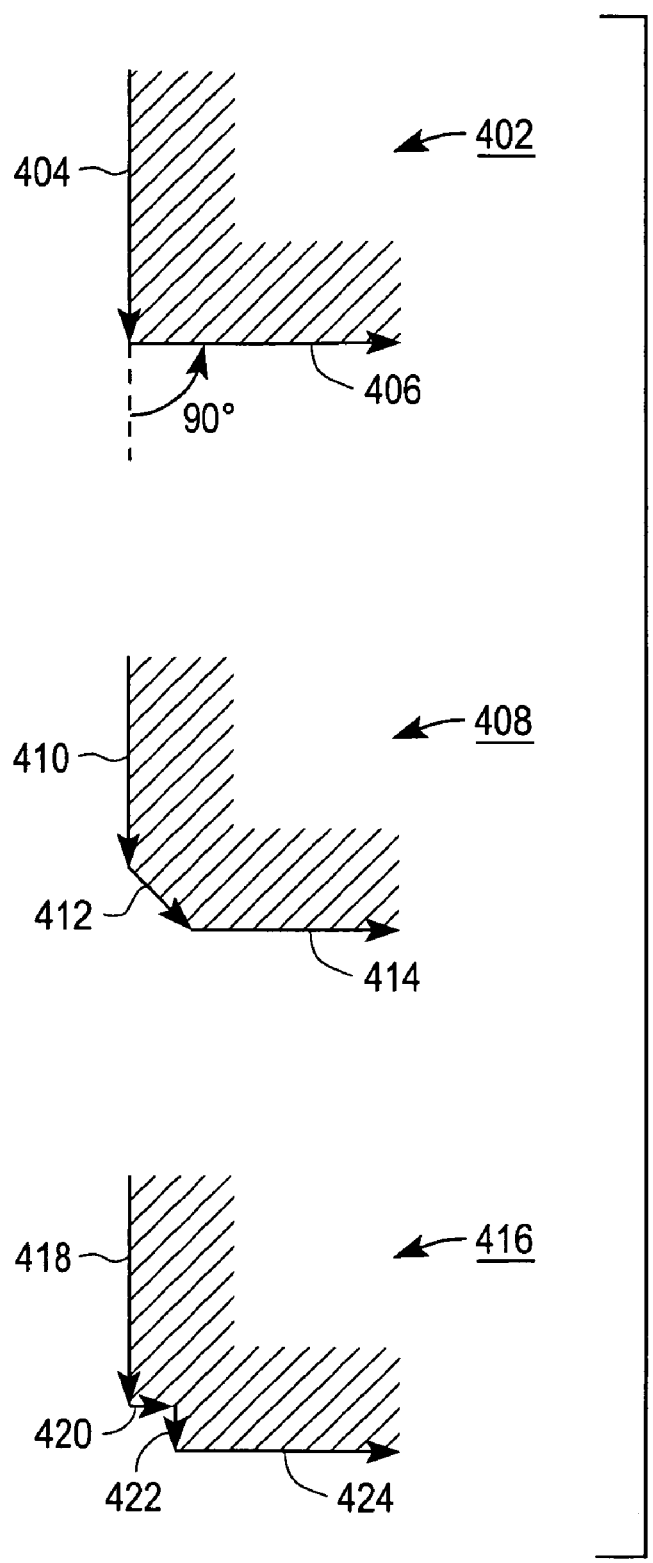
FIG. 4 illustrates the definition of an outer corner shape according to one embodiment of the present invention.

FIG. 4 illustrates the definition of an outer corner shape according to one embodiment of the present invention. A simple way to define an outer corner shape is two edges joined together perpendicular to each other, with a 90 degree angle between the first and second edges. This simple definition can cover the simple outer corner shape 402, formed by the two edges 404, 406 with a 90-degree angle between them. However, this simple, rigid definition cannot include slight variations of the simple outer corner shape 402 such as the outer corner shapes 408, 416.

In order to cover variations of a shape in the shape definitions, the present invention uses transient edges to allow for flexible shape definitions, thereby allowing users to define a shape with greater accuracy and flexibility. Transient edges are one or more short edges, connected via two shape edges identified in a shape.

In one embodiment, the outer corner shape according to the present invention can be defined as a first edge satisfying a length condition (e.g., minimum length of 80 nm), a second edge satisfying another length condition (e.g., minimum length of 80 nm) and forming an edge transition angle (e.g., 90 degrees to 135 degrees) in relation to the first edge, and zero or more (e.g., zero to ten) transient edges connected between the first and second edges and satisfying still another length condition (e.g., maximum length of 80 nm). The transient edges need not satisfy any edge transition angle condition among themselves or in relation to the first or second edges. The first, second, and transient edges may be further fragmented.

According to this definition of the outer corner shape, the simple outer corner 402 is included in the outer corner shape because it has two edges 404, 406 forming a 90-degree angle with no transient edges. The variation 408 of the simple outer corner 402 is also included in the outer corner shape because it has two edges 410, 414 forming a 90-degree angle with a transient edge 412 connected between the two edges 410, 414. The other variation 416 of the simple outer corner 402 is also included in the outer corner shape because it has two edges 418, 424 forming a 90-degree angle with two transient edges 420, 422 connected between the two edges 418, 424. Therefore, by defining the outer corner shape using the transient edges, multiple variations of the simple outer corner 402 can be identified as the outer corner shape, thereby simplifying and allowing flexibility in the shape definition process for optical proximity correction.

Figure 5:
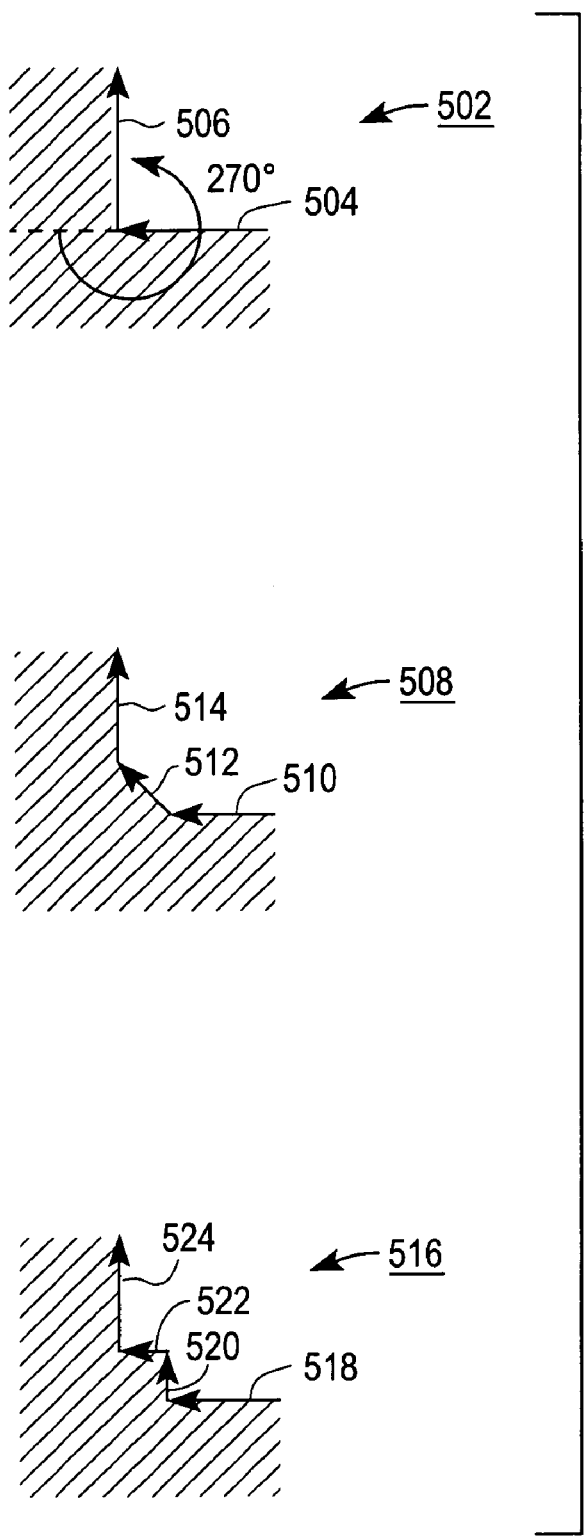
FIG. 5 illustrates the definition of an inner corner shape according to one embodiment of the present invention.

FIG. 5 is a diagram illustrating the definition of an inner corner shape according to one embodiment of the present invention. A simple way to define an inner corner shape is two edges joined together perpendicular to each other, with a 270 degree angle between the first and second edges. This simple definition can cover the simple inner corner shape 502, formed by the two edges 504, 506 with a 270-degree angle between them. However, this simple, rigid definition cannot include slight variations of the simple inner corner shape 502 such as the inner corner shapes 508, 516.

In one embodiment, the inner corner shape according to the present invention can be defined as a first edge satisfying a length condition (e.g., minimum length of 80 nm), a second edge satisfying another length condition (e.g., minimum length of 80 nm) and forming an edge transition angle (e.g., 270 degrees to 315 degrees) in relation to the first edge, and zero or more (e.g., zero to ten) transient edges connected between the first and second edges and satisfying still another length condition (e.g., maximum length of 80 nm). The transient edges need not satisfy any edge transition angle condition among themselves or in relation to the first or second edges. The first, second, and transient edges may be further fragmented.

According to this definition of the inner corner shape, the simple inner corner 502 is included in the inner corner shape because it has two edges 504, 506 forming a 270-degree angle with no transient edges. The variation 508 of the simple inner corner 502 is also included in the inner corner shape because it has two edges 510, 514 forming a 270-degree angle with a transient edge 512 connected between the two edges 510, 514. The other variation 516 of the simple inner corner 502 is also included in the inner corner shape because it has two edges 518, 524 forming a 270-degree angle with two transient edges 520, 522 connected between the two edges 518, 524. Therefore, by defining the inner corner shape using the transient edges, multiple variations of the simple inner corner 502 can be identified as the inner corner shape, thereby simplifying and allowing flexibility in the shape definition process for optical proximity correction.

Figure 6:
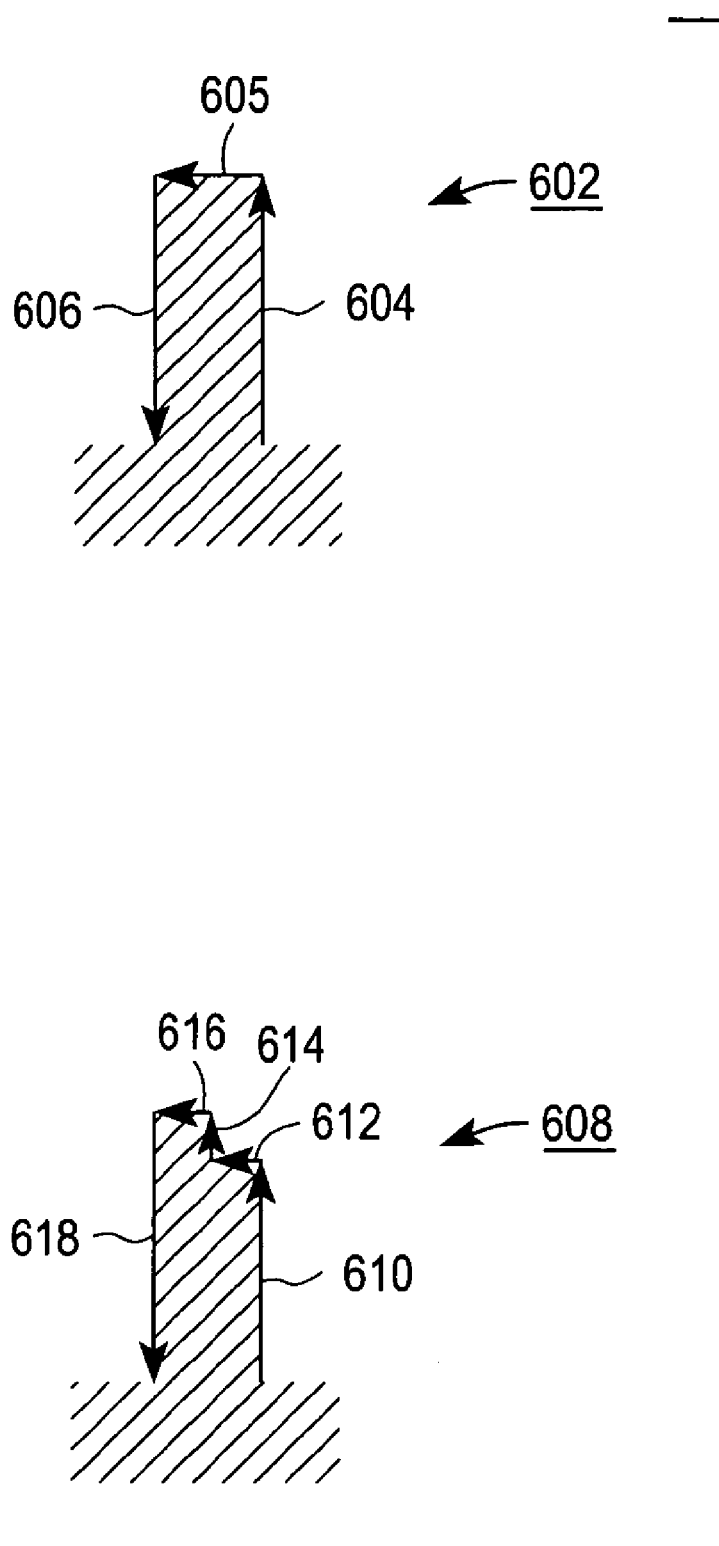
FIG. 6 illustrates the definition of a line end shape according to one embodiment of the present invention.

FIG. 6 is a diagram illustrating the definition of a line end shape according to one embodiment of the present invention. A simple way to define a line end shape is two edges with opposite directions with a 180-degree angle between the first and second edges, joined together by a relatively short edge in between the first and second edges. This simple definition can cover the simple line-end shape 602, formed by the two edges 604, 606 with a 180-degree angle between them, joined by a short edge 605. However, this simple, rigid definition cannot include slight variations of the simple line-end shape 602 such as the line-end shape 608.

In one embodiment, the line-end shape according to the present invention can be defined as a first edge satisfying a length condition (e.g., minimum length of 180 nm), a second edge satisfying another length condition (e.g., minimum length of 180 nm) and forming an edge transition angle of 180 degrees in relation to the first edge, and one or more (e.g., one to ten) transient edges connected between the first and second edges and satisfying still another length condition (e.g., maximum length of 180 nm). The transient edges need not satisfy any edge transition angle condition among themselves or in relation to the first or second edges. The first, second, and transient edges may be further fragmented.

According to this definition of the line-end shape, the simple line-end shape 602 is included in line-end shape because it has two edges 604, 606 forming a 180-degree angle with one transient edge 605 connected between the two edges 604, 606. The variation 608 of the simple line-end shape 602 is also included in the line-end shape because it has two edges 610, 618 forming a 180-degree angle with two transient edges 614, 616 connected between the two edges 610, 618. Therefore, by defining the line-end shape using transient edges, multiple variations of the simple line-end shape 602 can be identified as the line-end shape, thereby simplifying and allowing flexibility in the shape definition process for optical proximity correction.

Figure 7:
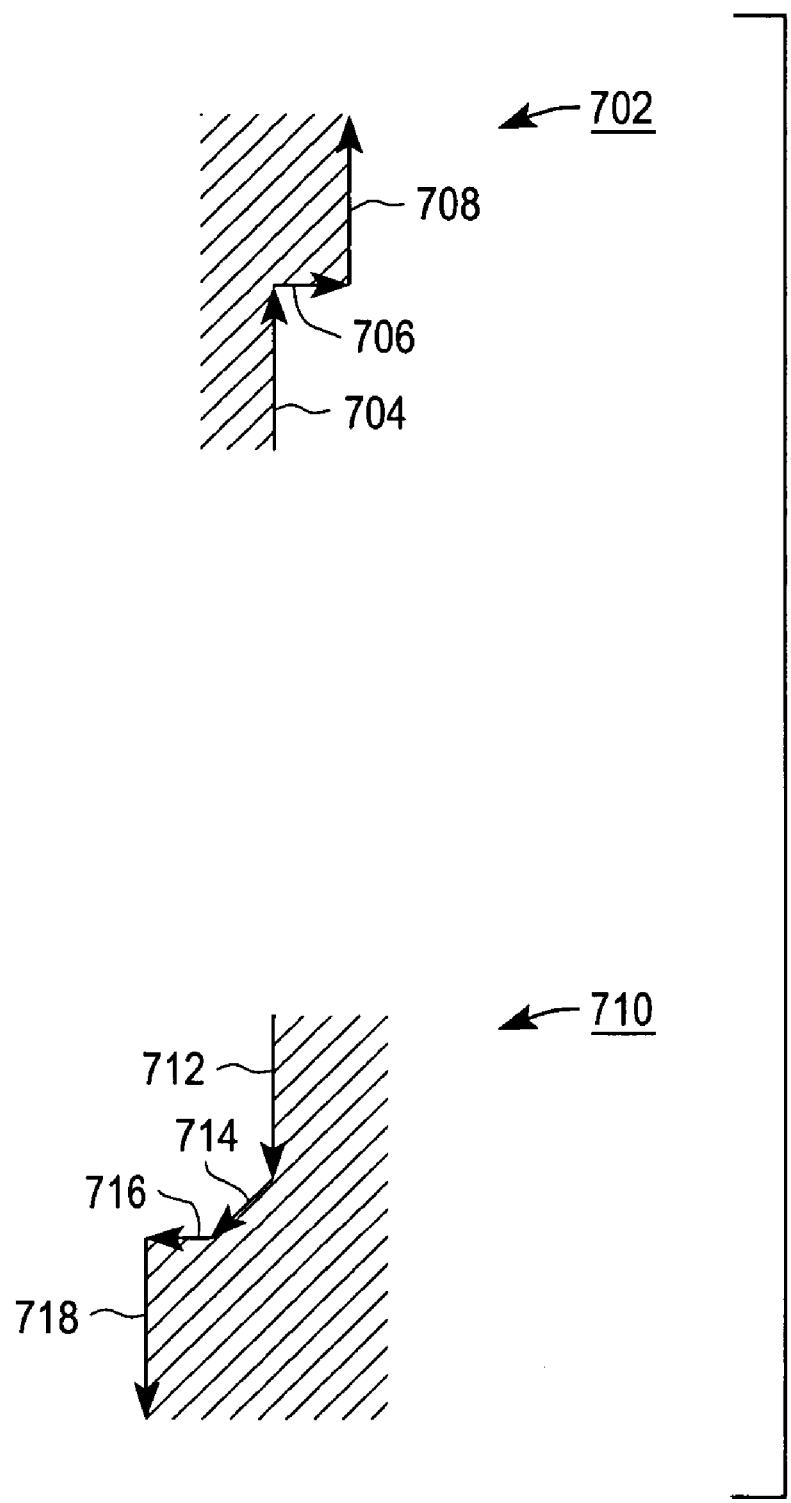
FIG. 7 illustrates the definition of a turn end shape according to one embodiment of the present invention.

FIG. 7 is a diagram illustrating the definition of a turn end shape according to one embodiment of the present invention. A simple way to define a turn end shape is two edges with the same directions with a 0 degree angle between the first and second edges, joined together by a relatively short edge in between the first and second edges. This simple definition can cover the simple turn-end shape 702, formed by the two edges 704, 708 with a 0 degree angle between them, joined by a short edge 706. However, this simple, rigid definition cannot include slight variations of the simple turn-end shape 702 such as the turn-end shape 710.

In one embodiment, the turn-end shape according to the present invention can be defined as a first edge satisfying a length condition (e.g., minimum length of 180 nm), a second edge satisfying another length condition (e.g., minimum length of 180 nm) and forming an edge transition angle of 0 degrees in relation to the first edge, and one or more (e.g., one to ten) transient edges connected between the first and second edges and satisfying still another length condition (e.g., maximum length of 180 nm). The transient edges need not satisfy any edge transition angle condition among themselves or in relation to the first or second edges. The first, second, and transient edges may be further fragmented.

According to this definition of the turn-end shape, the simple turn-end shape 702 is included in the turn-end shape because it has two edges 704, 708 forming a 0-degree angle with one transient edge 706 connected between the two edges 704, 708. The variation 710 of the simple turn-end shape 702 is also included in the turn-end shape because it has two edges 712, 718 forming a 0-degree angle with two transient edges 714, 716 connected between the two edges 712, 718. Therefore, by defining the turn-end shape using transient edges, multiple variations of the simple turn-end shape 702 can be identified as the turn-end shape, thereby simplifying and allowing flexibility in the shape definition process for optical proximity correction.

Figure 8:
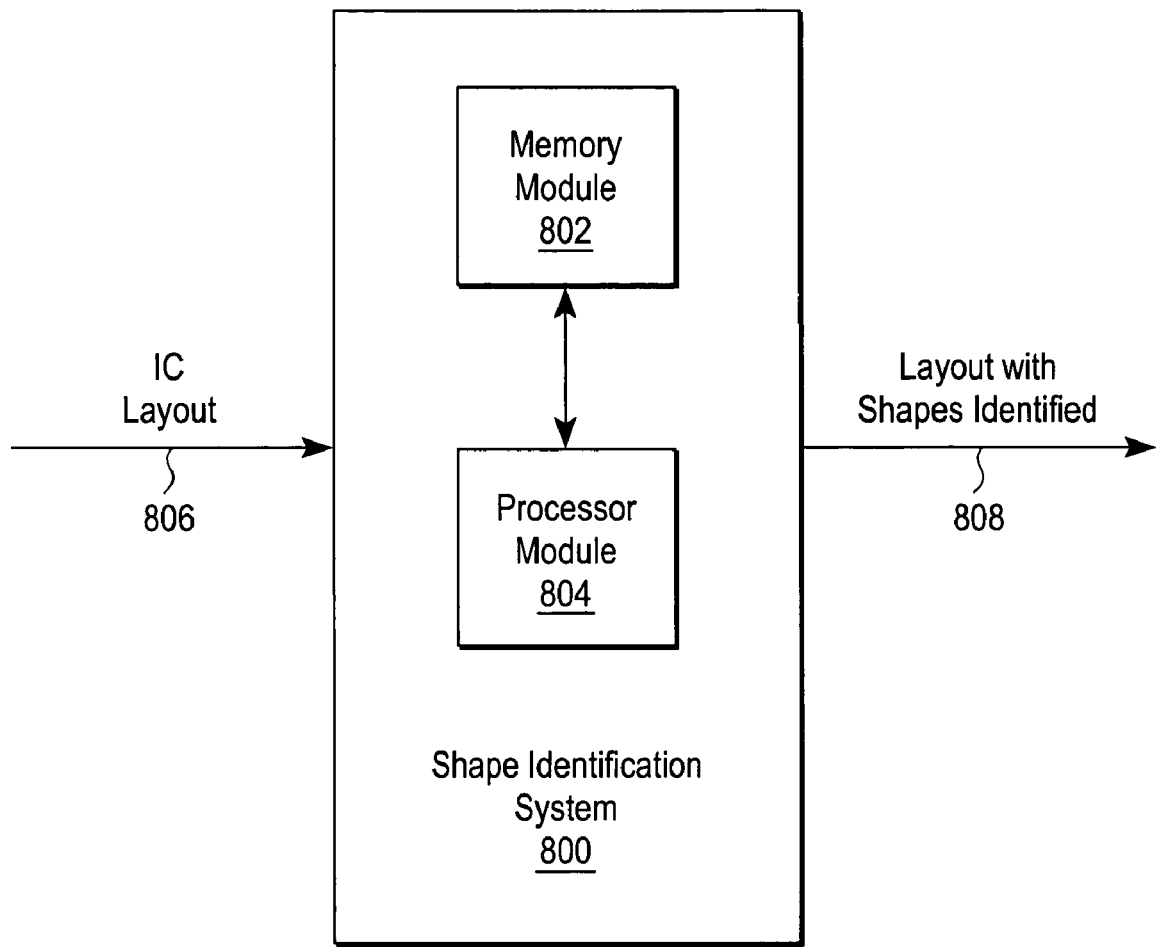
FIG. 8 is a block diagram illustrating a shape identification system according to one embodiment of the present invention.

FIG. 8 is a diagram illustrating a shape identification system 800 according to one embodiment of the present invention. The shape identification system 800 receives IC layouts 806, and identifies various shapes in the IC layouts according to the methods described in, for example, FIGS. 4-7 to generate another layout 808 with the various shapes identified therein.

The shape identification system 800 may be a computer that runs shape identification software configured to perform such shape identification according to the present invention. Such computer includes at least a processor module 804 for running such shape identification software and a memory module 802 for storing such shape identification software. Such shape identification software may be stored as a computer program product on a separate computer readable medium or on a memory device 802 as firmware within the computer for the shape identification system 800. The shape identification software can also be part of larger software for optical proximity correction.

Although the present invention has been described above with respect to several embodiments, various modifications can be made within the scope of the present invention. For example, the flexible shape identification method of the present invention is applicable not only to optical proximity correction but also to other types of resolution enhancement. The various shape definitions described in FIGS. 4-7 are merely exemplary, and the flexible shape identification method of the present invention can be used to define other various shapes not described herein. For example, although shapes including two edges and transitional edges connected between those two edges are generally discussed herein, the present invention covers shapes that may have additional edges, such as a shape having an additional edge connected to one of the two edges in a shape comprised of the two edges and transitional edges connected between the two edges. Accordingly, the disclosure of the present invention is intended to be illustrative, but not limiting, of the scope of the invention, which is set forth in the following claims.

What is claimed is:

1. A computer-implemented method of identifying a shape in an integrated circuit layout for resolution enhancement, the method comprising:
    identifying a first edge satisfying a first minimum length condition in the layout;
    identifying a second edge satisfying a second minimum length condition and an edge transition angle condition in relation to the first edge in the layout;
    identifying one or more first transition edges satisfying a first maximum length condition and connected between the first edge and the second edge in the layout, a first variation of the shape including the first edge, the second edge, and the first transition edges;
    identifying a third edge satisfying a third minimum length condition in the layout;
    identifying a fourth edge satisfying a fourth minimum length condition and the edge transition angle condition in relation to the third edge in the layout; and
    identifying one or more second transition edges satisfying a second maximum length condition and connected between the third edge and the fourth edge in the layout, a second variation of the shape including the third edge, the fourth edge, and the second transition edges,
    wherein the first transition edges are different from the second transition edges but both the first variation of the shape and the second variation of the shape being identified as having the same shape.

2. The computer-implemented method of claim 1, wherein the shape is an outer corner shape, the edge transition angle is 90 degrees to 135 degrees, and there are zero to a predetermined number of the first transition edges and zero to the predetermined number of the second transition edges.

3. The computer-implemented method of claim 1, wherein the shape is an inner corner shape, the edge transition angle is 270 degrees to 315 degrees, and there are zero to a predetermined number of the first transition edges and zero to the predetermined number of the second transition edges.

4. The computer-implemented method of claim 1, wherein the shape is a line-end shape, the edge transition angle is 180 degrees, and there are one to a predetermined number of the first transition edges and one to the predetermined number of the second transition edges.

5. The computer-implemented method of claim 1, wherein the shape is a turn-end shape, the edge transition angle is 0 degrees, and there are one to a predetermined number of the first transition edges and one to the predetermined number of the second transition edges.

6. The computer-implemented method of claim 1, wherein the edge transition angle is measured by extending the first edge and measuring an angle counter-clockwise from the extended first edge to the second edge, the first and second edges being in the order of tracing of the first and second edges counter-clockwise.

7. The computer-implemented method of claim 1, wherein the edge transition angle is measured by extending the first edge and measuring an angle counter-clockwise from the extended first edge to the second edge, the first and second edges being in the order of tracing of the first and second edges clockwise.

8. The computer-implemented method of claim 1, wherein the first edge, the second edge, the first transition edges, the third edge, the fourth edge, and the second transition edges are located between polygon vertices on the layout.

9. The computer-implemented method of claim 1, wherein the first edge, the second edge, the first transition edges, the third edge, the fourth edge, and the second transition edges are further fragmented.

10. The computer-implemented method of claim 1, wherein the resolution enhancement comprises optical proximity correction of the layout.

11. An integrated circuit layout comprising:
    a first edge satisfying a first minimum length condition;
    a second edge satisfying a second minimum length condition and an edge transition angle condition in relation to the first edge;
    one or more first transition edges satisfying a first maximum length condition and connected between the first edge and the second edge, a first variation of the shape including the first edge, the second edge, and the first transition edges;
    a third edge satisfying a third minimum length condition;
    a fourth edge satisfying a fourth minimum length condition and the edge transition angle condition in relation to the third edge; and
    one or more second transition edges satisfying a second maximum length condition and connected between the third edge and the fourth edge, a second variation of the shape including the third edge, the fourth edge, and the second transition edges,
    wherein the first transition edges are different from the second transition edges but both the first variation of the shape and the second variation of the shape being identified as having the same shape.

12. The integrated circuit layout of claim 11, wherein the shape is an outer corner shape, the edge transition angle is 90 degrees to 135 degrees, and there are zero to a predetermined number of the first transition edges and zero to the predetermined number of the second transition edges.

13. The integrated circuit layout of claim 11, wherein the shape is an inner corner shape, the edge transition angle is 270 degrees to 315 degrees, and there are zero to a predetermined number of the first transition edges and zero to the predetermined number of the second transition edges.

14. The integrated circuit layout of claim 11, wherein the shape is a line-end shape, the edge transition angle is 180 degrees, and there are one to a predetermined number of the first transition edges and one to the predetermined number of the second transition edges.

15. The integrated circuit layout of claim 11, wherein the shape is a turn-end shape, the edge transition angle is 0 degrees, and there are one to a predetermined number of the first transition edges and one to the predetermined number of the second transition edges.

16. The integrated circuit layout of claim 11, wherein the edge transition angle is measured by extending the first edge and measuring an angle counter-clockwise from the extended first edge to the second edge, the first and second edges being in the order of tracing of the first and second edges counter-clockwise.

17. The integrated circuit layout of claim 11, wherein the edge transition angle is measured by extending the first edge and measuring an angle counter-clockwise from the extended first edge to the second edge, the first and second edges being in the order of tracing of the first and second edges clockwise.

18. The integrated circuit layout of claim 11, wherein the first edge, the second edge, the first transition edges, the third edge, the fourth edge, and the second transition edges are located between polygon vertices on the layout.

19. The integrated circuit layout of claim 11, wherein the first edge, the second edge, the first transition edges, the third edge, the fourth edge, and the second transition edges are further fragmented.

20. The integrated circuit layout of claim 11, wherein the resolution enhancement comprises optical proximity correction of the layout.

21. A computer readable medium storing a computer program product configured to perform a method of identifying a shape in an integrated circuit layout for resolution enhancement, the method comprising:
    identifying a first edge satisfying a first minimum length condition in the layout;
    identifying a second edge satisfying a second minimum length condition and an edge transition angle condition in relation to the first edge in the layout;
    identifying one or more first transition edges satisfying a first maximum length condition and connected between the first edge and the second edge in the layout, a first variation of the shape including the first edge, the second edge, and the first transition edges;
    identifying a third edge satisfying a third minimum length condition in the layout;
    identifying a fourth edge satisfying a fourth minimum length condition and the edge transition angle condition in relation to the third edge in the layout; and
    identifying one or more second transition edges satisfying a second maximum length condition and connected between the third edge and the fourth edge in the layout, a second variation of the shape including the third edge, the fourth edge, and the second transition edges,
    wherein the first transition edges are different from the second transition edges but both the first variation of the shape and the second variation of the shape being identified as having the same shape.

22. The computer readable medium of claim 21, wherein the shape is an outer corner shape, the edge transition angle is 90 degrees to 135 degrees, and there are zero to a predetermined number of the first transition edges and zero to the predetermined number of the second transition edges.

23. The computer readable medium of claim 21, wherein the shape is an inner corner shape, the edge transition angle is 270 degrees to 315 degrees, and there are zero to a predetermined number of the first transition edges and zero to the predetermined number of the second transition edges.

24. The computer readable medium of claim 21, wherein the shape is a line-end shape, the edge transition angle is 180 degrees, and there are one to a predetermined number of the first transition edges and one to the predetermined number of the second transition edges.

25. The computer readable medium of claim 21, wherein the shape is a turn-end shape, the edge transition angle is 0 degrees, and there are one to a predetermined number of the first transition edges and one to the predetermined number of the second transition edges.

26. The computer readable medium of claims 21, wherein the edge transition angle is measured by extending the first edge and measuring an angle counter-clockwise from the extended first edge to the second edge, the first and second edges being in the order of tracing of the first and second edges counter-clockwise.

27. The computer readable medium of claim 21, wherein the edge transition angle is measured by extending the first edge and measuring an angle counter-clockwise from the extended first edge to the second edge, the first and second edges being in the order of tracing of the first and second edges clockwise.

28. The computer readable medium of claim 21, wherein the first edge, the second edge, the first transition edges, the third edge, the fourth edge, and the second transition edges are located between polygon vertices on the layout.

29. The computer readable medium of claim 21, wherein the first edge, the second edge, the first transition edges, the third edge, the fourth edge, and the second transition edges are further fragmented.

30. The computer readable medium of claim 21, wherein the resolution enhancement comprises optical proximity correction of the layout.

31. A shape identification system for use in resolution enhancement of a layout of an integrated circuit, the shape identification system comprising:
    a memory module storing computer instructions configured to perform a method of identifying a shape in the layout for resolution enhancement, the method comprising the steps of:
        identifying a first edge satisfying a first minimum length condition in the layout;
        identifying a second edge satisfying a second minimum length condition and an edge transition angle condition in relation to the first edge in the layout;
        identifying one or more first transition edges satisfying a first maximum length condition and connected between the first edge and the second edge in the layout, a first variation of the shape including the first edge, the second edge, and the first transition edges;
        identifying a third edge satisfying a third minimum length condition in the layout;
        identifying a fourth edge satisfying a fourth minimum length condition and the edge transition angle condition in relation to the third edge in the layout; and identifying one or more second transition edges satisfying a second maximum length condition and connected between the third edge and the fourth edge in the layout, a second variation of the shape including the third edge, the fourth edge, and the second transition edges, wherein the first transition edges are different from the second transition edges but both the first variation of the shape and the second variation of the shape being identified as having the same shape; and a processor module for executing the computer instructions.

32. The shape identification system of claim 31, wherein the shape is an outer corner shape, the edge transition angle is 90 degrees to 135 degrees, and there are zero to a predetermined number of the first transition edges and zero to the predetermined number of the second transition edges.

33. The shape identification system of claim 31, wherein the shape is an inner corner shape, the edge transition angle is 270 degrees to 315 degrees, and there are zero to a predetermined number of the first transition edges and zero to the predetermined number of the second transition edges.

34. The shape identification system of claim 31, wherein the shape is a line-end shape, the edge transition angle is 180 degrees, and there are one to a predetermined number of the first transition edges and one to the predetermined number of the second transition edges.

35. The shape identification system of claim 31, wherein the shape is a turn-end shape, the edge transition angle is 0 degrees, and there are one to a predetermined number of the first transition edges and one to the predetermined number of the second transition edges.

36. The shape identification system of claim 31, wherein the edge transition angle is measured by extending the first edge and measuring an angle counter-clockwise from the extended first edge to the second edge, the first and second edges being in the order of tracing of the first and second edges counter-clockwise.

37. The shape identification system of claim 31, wherein the edge transition angle is measured by extending the first edge and measuring an angle counter-clockwise from the extended first edge to the second edge, the first and second edges being in the order of tracing of the first and second edges clockwise.

38. The shape identification system of claim 31, wherein the first edge, the second edge, the first transition edges, the third edge, the fourth edge, and the second transition edges are located between polygon vertices on the layout.

39. The shape identification system of claim 31, wherein the first edge, the second edge, the first transition edges, the third edge, the fourth edge, and the second transition edges are further fragmented.

40. The shape identification system of claim 31, wherein the resolution enhancement comprises optical proximity correction of the layout.

* * * * *